(12) United States Patent
Nemati et al.

(10) Patent No.: US 6,756,612 B1
(45) Date of Patent: Jun. 29, 2004

(54) CARRIER COUPLER FOR THYRISTOR-BASED SEMICONDUCTOR DEVICE

(75) Inventors: Farid Nemati, Menlo Park, CA (US); Badredin Fatemizadeh, San Jose, CA (US); Andrew Horch, Mountain View, CA (US); Scott Robins, San Jose, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/282,331

(22) Filed: Oct. 28, 2002

(51) Int. Cl.[7] .............................................. H01L 29/74
(52) U.S. Cl. ....................... 257/156; 257/133; 257/155; 257/163; 365/180
(58) Field of Search ................................ 257/133, 137, 257/140, 142, 146, 148, 152, 155, 156, 163; 365/174, 180, 182

(56) References Cited

U.S. PATENT DOCUMENTS

| | | | | |
|---|---|---|---|---|
| 4,395,723 A | * | 7/1983 | Harari | 257/260 |
| 4,797,373 A | | 1/1989 | Malhi et al. | 438/249 |
| 5,132,767 A | * | 7/1992 | Ogura et al. | 257/153 |
| 5,528,062 A | | 6/1996 | Hsieh et al. | 257/298 |
| 5,600,160 A | * | 2/1997 | Hvistendahl | 257/288 |
| 6,084,274 A | * | 7/2000 | Mukai et al. | 257/390 |
| 6,104,045 A | | 8/2000 | Forbes et al. | 257/141 |
| 6,225,165 B1 | | 5/2001 | Noble, Jr. et al. | 438/268 |
| 6,229,161 B1 | | 5/2001 | Nemati et al. | 257/133 |
| 6,545,297 B1 | * | 4/2003 | Noble, Jr. et al. | 257/124 |
| 6,583,452 B1 | * | 6/2003 | Cho et al. | 257/107 |
| 2002/0190265 A1 | * | 12/2002 | Hsu et al. | 257/107 |

FOREIGN PATENT DOCUMENTS

| | | | | |
|---|---|---|---|---|
| JP | 3-16089 | * | 1/1991 | 365/174 |

OTHER PUBLICATIONS

NN80081017, Single Thyristor Static Memory and its Fabrication, Aug. 1980, IBM, Technical Disclosure Bulletin, vol. 23, Issue 3, pp. 1017–1025.*

Zeng et al., Effect of Carrier Lifetimes on Forward Characteristics of MOS–Controlled Thyristors, Jun. 1995, IEE, IEE Proc.–Circuits Devices Syst., vol. 142, No. 3, pp. 205–207.*

Kim et al., Realization of a Fast Switching Thyristor by Local Carrier Lifetime Control, May 2002, IEEE, Proc. 23rd International Conferance on Microelectronics, vol. 1, pp. 193–196.*

K. DeMeyer, S. Kubicek and H. van Meer, *Raised Source/Drains with Disposable Spacers for sub 100 nm CMOS technologies*, Extended Abstracts of International Workshop on Junction Technology 2001.

Mark Rodder and D. Yeakley, *Raised Source/Drain MOSFET with Dual Sidewall Spacers*, IEEE Electron Device Letters, vol. 12, No. 3, Mar. 1991.

(List continued on next page.)

Primary Examiner—George Eckert (57) ABSTRACT

Switching times of a thyristor-based semiconductor device are improved by enhancing carrier drainage from a buried thyristor-emitter region. According to an example embodiment of the present invention, a conductive contact extends to a doped well region buried in a substrate and is adapted to drain carriers therefrom. The device includes a thyristor body having at least one doped emitter region buried in the doped well region. A conductive thyristor control port is adapted to capacitively couple to the thyristor body and to control current flow therein. With this approach, the thyristor can be rapidly switched between resistance states, which has been found to be particularly useful in high-speed data latching implementations including but not limited to memory cell applications.

18 Claims, 6 Drawing Sheets

OTHER PUBLICATIONS

Yang–Kyu Choi, Daewon Ha, Tsu–Jae King and Chenming Hu, *Nanoscale Ultrathin Body PMOSFETs With Raised Selective Germanium Source/Drain*, IEEE Electron Device Letters, vol. 22, No. 9, Sep. 2001.

N. Lindert, Y.–K. Choi, L. Chang, E. Anderson, W.–C. Lee, T.–J. King, J. Bokor, and C. Hu, *Quasi–Planar FinFETs with Selectively Grown Germanium Raised Source/Drain*, 2001 IEEE International SOI Conference, Oct. 1, 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, *High Performance RF Characteristics of Raised Gate/Source/Drain CMOS with Co Salicide*, 1998 Symposium on VLSI Technology Digest of Technical Papers.

Hsiang–Jen Huang, Kun–Ming Chen, Tiao–Yuan Huang, Tien–Sheng Chao, Guo–Wei Huang, Chao–Hsin Chien, and Chun–Yen Chang, *Improved Low Temperature Characteristics of P–Channel MOSFETs with $Si_{1-x}Ge_x$ Raised Source and Drain*, IEEE Transactions on Electron Devices, vol. 48, No. 8, Aug. 2001.

Stanley Wolf Ph.D. and Richard N. Tauber Ph.D., *Silicon Processing for The VLSI Era*, vol. 1, 1986, pp. 285–286.

Nemati, Farid, and Plummer, James D., "A Novel High Density, Low Voltage SRAM Cell with a Vertical NDR Device", VLSI Technology Technical Digest, Jun. 1998.

Nemati, Farid, and Plummer James, D., "A Novel Thyristor–based SRAM Cell (T–RAM) for High–Speed, Low–Voltage, Giga–scale Memories", International Electron Device Meeting Technical Digest, 1999.

\* cited by examiner

CARRIER COUPLER FOR THYRISTOR-BASED SEMICONDUCTOR DEVICE

FIELD OF THE INVENTION

The present invention is directed to semiconductor devices and, more specifically, to semiconductor devices having thyristor-based devices.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density 0has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. Another important consideration in semiconductor device design, including those employing thin capacitively-coupled thyristor-type devices, includes forming devices in an arrangement that realizes high density and fast switching attributes. Because of these high-density and speed-related constraints, the thin capacitively-coupled thyristor is a unique type of NDR device that presents many challenges (e.g., versus a power thyristor).

In microprocessor implementations running at relatively fast clock speeds (e.g., speeds in excess of 1 GHz that result in a memory cycle time of about 1 nanosecond), a thin capacitively-coupled thyristor for memory implementations would advantageously have a write cycle time that is on the same order as the microprocessor. However, thyristors typically switch from a low resistance state to a blocking state over a period that is greater than about 1 microsecond. In connection with the present invention, it has been discovered that this relatively slow switching time is related to the time it takes for minority carriers in an emitter region of the thyristor to recombine. In addition, the thyristor will not switch into or stay in its blocking state if the minority charge carriers are not recombined, and uncombined charge carriers can migrate to other devices and adversely affect the operation thereof. Long access times that can result from slow thyristor switching have typically not been an issue in power applications; however, overcoming these timing challenges can benefit a wide variety of thyristor-based applications, including high-speed memory applications and power applications.

These and other considerations have presented challenges to the implementation of such a thin capacitively-coupled thyristor with bulk substrate applications, and in particular with highly-dense applications having an emitter region of the thyristor buried in a doped well region of the substrate.

SUMMARY

The present invention is directed to overcoming the above-mentioned challenges and others related to the types of devices and applications discussed above and in other memory cells. The present invention is exemplified in a number of implementations and applications, some of which are summarized below.

According to an example embodiment of the present invention, a thyristor-based semiconductor device includes a carrier coupler that drains carriers that accumulate in a well region adjacent to a buried emitter region of a thyristor as a result of carrier drainage from the buried emitter region. The carrier drainage reduces the lifetime of carriers in the buried emitter region, which in turn increases the speed at which the thyristor can switch between blocking and conducting states. In addition, the carrier coupler drains carriers that may otherwise migrate to other circuitry adjacent to the thyristor and cause problems therein. With this approach, challenges to the implementation of such devices, including those discussed above, can be addressed.

In another example embodiment of the present invention, a thyristor-based memory cell includes a carrier coupler, such as the one discussed above, which drains carriers from a well region adjacent to an emitter region of the thyristor. The memory cell includes a substrate with a thyristor body having a first doped emitter region buried in a doped well region of the substrate. The first doped emitter region and the well region are of opposite polarity, and the doped well region is susceptible to carrier accumulation via carrier drainage from the doped emitter region. A first base region is coupled between the first doped emitter region and a second base region, and the second base region is coupled between the first base region and a second doped emitter region. The first doped emitter region is electrically coupled to a reference voltage signal. A pass device (e.g., a transistor) is electrically coupled between a bit line and the second doped emitter region and electrically couples the bit line to the second doped emitter region in response to a signal applied thereto. A control port is disposed adjacent to the second base region and is adapted to capacitively couple as signal thereto for controlling current in the thyristor body. A carrier coupler is electrically coupled to the doped well region and drains carriers that accumulate therein from the first doped emitter region.

In another example embodiment of the present invention, a thyristor-based semiconductor device having a substrate and a thyristor body region therein is manufactured with a carrier coupler adapted to drain carriers from an emitter region of the thyristor. A trench is etched in the substrate adjacent to a thyristor body region and a first dopant is implanted in both a portion of the thyristor body region and a first portion of the substrate via the bottom of the trench. The first dopant is implanted at a first implant energy and forms a first doped well region and a first base region of the thyristor body region. The first doped well region is annealed, and a first thyristor emitter region is implanted in the first doped well region. The first thyristor emitter region is contiguously adjacent to the first base region and is of a polarity that is opposite the polarity of the first doped well region. Remaining portions of the thyristor are formed, including a first and second base region and a second emitter region, with the first base region being coupled between the first emitter region and the second base region and with the second base region being coupled between the first base region and the second emitter region. The carrier coupler is formed extending to the first doped well region for draining carriers that accumulate in the first emitter region during operation of the thyristor. A control port is formed in the trench and adapted to capacitively couple to the second base region for controlling current flow between the first and second emitter regions.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to different types of thyristor-based semiconductor applications, and has been found to be particularly useful for such applications with an emitter region buried in a doped well region of a semiconductor substrate. In a thin capacitively-coupled thyristor application, the present invention permits highly dense circuit arrangements that operate at switching speeds that are on the order of those used in typical microprocessors. While the present invention is not necessarily limited to such applications, various aspects of the invention may be appreciated through a discussion of various examples using this context.

According to an example embodiment of the present invention, a carrier coupler is adapted to reduce the lifetime of carriers in a thyristor emitter region buried in a well region of a thyristor-based semiconductor device. The reduced carrier lifetime facilitates switching of the thyristor between high and low resistance states. This is particularly useful in memory applications where draining carriers from an emitter region quickly results in significantly faster thyristor switching times.

The carrier coupler may include one or more of a variety of mechanisms. In one implementation, the carrier coupler includes a conductive contact to the well region. The conductive contact is adapted to electrically couple to the well region and to drain carriers therefrom (e.g., carriers accumulated from an emitter of the thyristor buried therein). In another implementation, the carrier coupler includes a reversed biased junction that is adapted to reduce carrier lifetime in the emitter region. In still another implementation, the carrier coupler includes a low resistance connection to a doped semiconductor region near the emitter that is adapted to maintain the emitter in a reverse-biased state. With this approach, the activation of unwanted parasitic bipolar junction transistors (e.g., that would otherwise be formed in substrate adjacent to the thyristor) can be prevented. For general information regarding carriers, and for specific information regarding approaches to carrier coupling that may be implemented in connection with one or more example embodiments herein, reference may be made to U.S. Provisional Patent Application Serial No. 60/415,356 filed on Oct. 1, 2002 and entitled "Novel Minority Carrier Isolation Device," and fully incorporated herein by reference.

Figure 1:
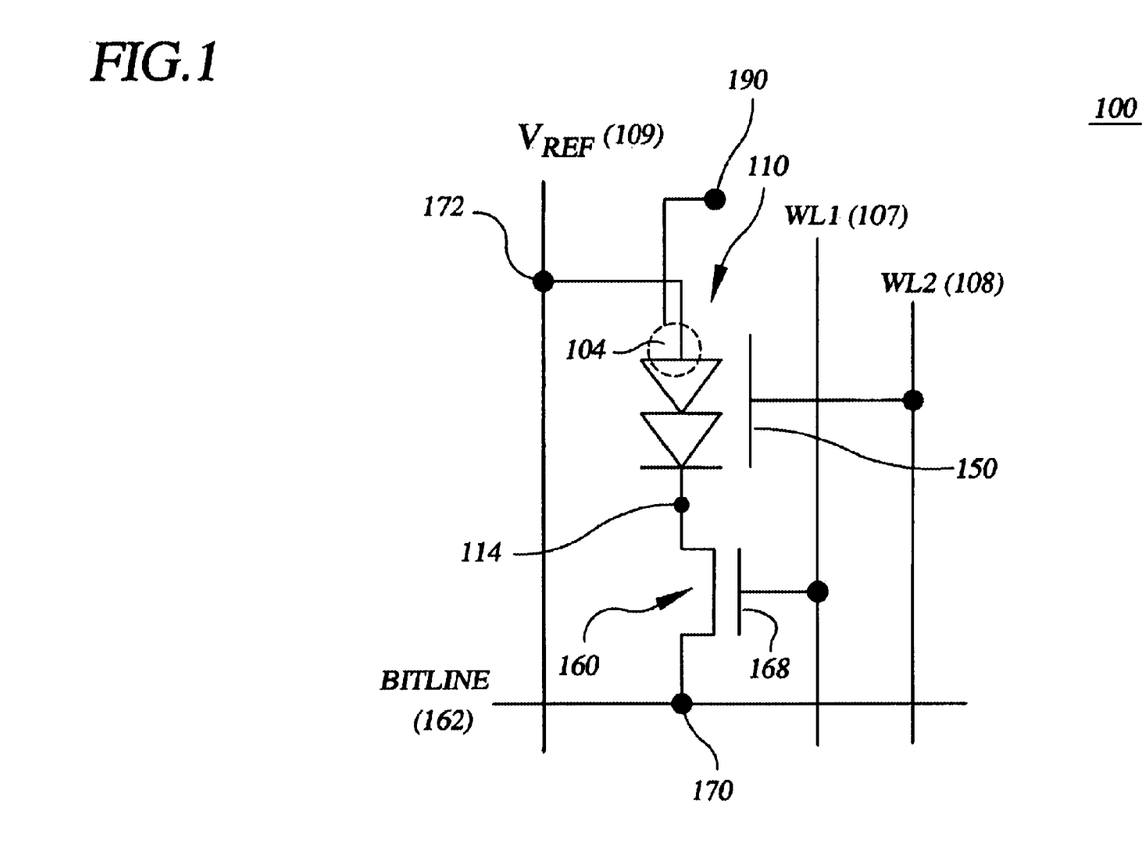
FIG. 1 is a circuit including a thyristor-based device having an anode contact with a varied width, according to another example embodiment of the present invention.

The present invention is applicable to a variety of devices and circuit arrangements. FIG. 1 is one such circuit arrangement 100, according to a more particular example embodiment of the present invention. The circuit arrangement 100 includes a thyristor body 110 and a pass device 160 (shown implemented as a transistor) that are electrically coupled in series and adapted for storing data at a storage node 114. Control ports 150 and 168 are adapted to control current flow in the thyristor body 110 and the pass device 160, respectively, in response to signals applied to first (WL1) and second (WL2) wordlines 107 and 108. A contact 172 is adapted to electrically couple a signal from a reference voltage (Vref) line 109 to an emitter region of the thyristor body region 110. The emitter region is buried in a well region 104, shown with dashed lines, that is coupled to a well contact 190. Carriers that accumulate in the buried emitter region pass into the well region 104 and are drained by the well contact 190. In addition, a bitline contact 170 is adapted to electrically couple a signal from a bitline 162 to a source/drain region of the pass device 160.

In response to signals applied to WL1 and WL2, and using signals at the bitline 162 and Vref line 109, the device 100 is adapted for writing data to and/or reading data from the storage node 114. The control port is in a high aspect ratio trench having conductive filler material near a bottom portion of the trench that is lined with an insulative material. The lined bottom portion and conductive filler material fill the bottom portion of the trench and to electrically insulate portions of the thyristor body and control port. For more information regarding data storage and manipulation with a thyristor-based device, such as the device 100, and in particular for controlling current in a thyristor-based device with a capacitively-coupled control port, reference may be made to U.S. Pat. No. 6,229,161.

Figure 2:
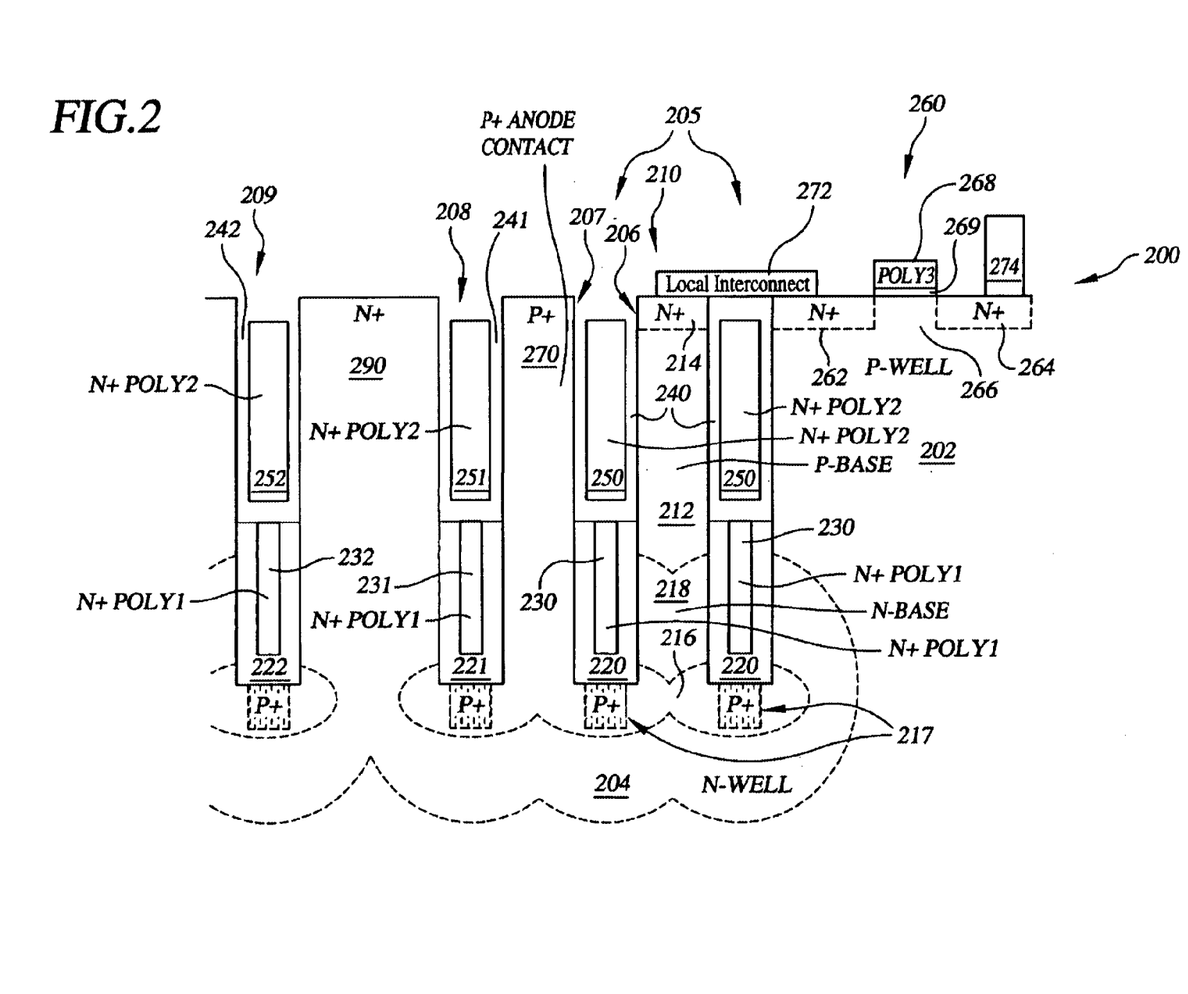
FIG. 2 is a semiconductor device having an anode contact, according to another example embodiment of the present invention.

FIG. 2 shows a semiconductor device 200 that may be implemented in connection with the circuit diagram shown in FIG. 1, according to another example embodiment of the present invention. A trench 205 has sidewall portions 206 and 207 in a P-well substrate 202 and around a thyristor body portion 210 in the substrate. An N-well region 204 is implanted in the P-well substrate 202, and a P+ emitter region 216 is implanted in the N-well 204. Alternatively, the N-well may include N-doped substrate or a N+ doped buried silicon layer, with epitaxially grown silicon over the N+ doped silicon. The thyristor body 210 includes the P+ emitter region 216, N-base region 218, P-base region 212 and N+ emitter region 214. The trench is lined with an insulative liner material 220, and a conductive filler material 230 (e.g., polysilicon or other material) is in a bottom portion of the lined trench. In one alternative (not shown), the conductive material 230 is replaced with an insulative material. The combination of the insulative liner 220 and the conductive filler material 230 fill the trench 205 and electrically isolate a portion of the thyristor region 210 from other circuitry in the substrate 202 (e.g., circuitry on an opposite side of the trench from the thyristor region 210). A dielectric material 240 is on the sidewall 206 of the trench and a control port 250 is adapted to capacitively couple to a base region 212 of the thyristor region 210 via the dielectric material 240 and to control current flow in the thyristor region. The control port 250, with the thyristor body region 210, form a thyristor device configured and arranged for storing data at the N+ emitter region 214.

A logic device 260 is electrically coupled in series with the thyristor via a local interconnect 272, with N+ source/drain regions 262 and 264 in a P-well region 202 and separated by a channel region 266. A gate dielectric material 269 separates the channel region 266 and a gate electrode 268 that is adapted to capacitively couple to the channel region via a gate dielectric material 269. The local interconnect 272 electrically couples the source/drain region 262 and the emitter region 214 of the thyristor. Another interconnect 274 electrically couples the source/drain region 264 to other circuitry in the device (e.g., interconnect 274 may include a bit line, such as bit line 162 in FIG. 1). The gate 268 is adapted to switch the channel 266 between a blocking state and a conducting state in response to a voltage being applied thereto, and thus to form a conductive channel between the bit line 274 and the emitter region 214.

Additional trenches 208 and 209 are in the substrate 202, are filled similarly to the trench 205 and may be formed simultaneously with the trench 205 for processing simplicity. Specifically, trench 208 is filled with an insulative liner 221 and conductive filler material 231 near the bottom of the trench. An upper portion of the trench is lined with a dielectric material 241 and filled with conductive material 251, such as the material used to form the control port 250. Similarly, trench 209 has an insulative liner 222, conductive filler material 232, dielectric material 242 and conductive material 252. Each of the trenches 208 and 209 may be filled with other materials, such as insulator materials. However, using the materials shown facilitates the simultaneous manufacture of trenches 205, 208 and 209.

The P-well substrate 202 between the trenches is used for making contact to buried portions of the thyristor device 200. Specifically, a portion of the substrate 202 is implanted with P+ material to form a P+ anode contact 270 that is adapted to electrically couple to the P+ emitter region 216. In addition, another portion of the substrate 202 is implanted with N+ material to form an N-well contact 290 that is adapted to electrically couple to the implanted N-well region 204 and to reduce carrier lifetime in the P+ anode emitter 216.

In one particular implementation, the thyristor (including the body region 210 and the control port 250) in FIG. 2 is a thin capacitively-coupled thyristor that is adapted to be selectively switched between a low resistance state and a blocking state for writing data in memory applications. The thin capacitively-coupled thyristor exhibits a reduced switching time, relative to the switching time of a conventional thyristor, for use in high-speed memory elements. The control port 250 is adapted to quickly eliminate minority carriers from the base region 212 to which the control port is capacitively coupled, and the N-well contact 290 is adapted to eliminate minority carriers from the buried emitter region 216. In one implementation, the N-well contact 290 is adapted to be held at a voltage that effects a reversed biased junction a short distance away from the lower emitter region.

In another example embodiment of the present invention, the thyristor-based semiconductor device includes carrier recombination centers 217 in a current path through the emitter region 216. The carrier recombination centers 217 are adapted to speed the turn off time of the thyristor. In one implementation, the carrier recombination centers 217 include ion-implanted dopants, such as metal atoms, and in another implementation, the carrier recombination centers 217 include silicon lattice damage created during the manufacture of the device 200. The dopants and/or the lattice defects, which can be implemented together, both assist in the recombination of carriers in the emitter region 216.

In another example embodiment of the present invention, the thyristor-based device of FIG. 2 is adapted for use as a memory cell. Specifically, the N+ emitter region 214 is adapted to store data for read and write access. Interconnect 274 is used as a bitline, the gate 268 is part of a first wordline, the control port 250 is part of a second wordline and the P+ anode contact 270 is coupled to a reference voltage. The bitline is electrically coupled to the N+ emitter region 214 when the logic device 260 (used here as a pass device that provides access to the storage node 214) is in a conducting state effected by a voltage being applied to the first word line. In addition, the N+ emitter region 214 is electrically coupled to the P+ anode contact 270 in response to a voltage being applied to the second word line, and the voltage of the P+ anode contact 270 is applied to the N+ emitter region. By controlling the first and second wordlines and the bitline, read and/or write access to the N+ emitter region 214 is effected. For more information regarding data storage and manipulation with a thyristor-based device, such as the device 200, and in particular for controlling current in a thyristor-based device with a capacitively-coupled control port, reference may be made to U.S. Pat. No. 6,229,161. Various ones of the example embodiments described below in connection with the figures share similar features with each other and with FIGS. 1 and 2. In each of these figures, certain discussion of similar features that are similarly numbered is omitted for brevity. In addition, for general information regarding semiconductor devices, and for specific information regarding trench-type approaches that may be implemented in connection with one or more of the example embodiments of the present invention, reference may be made to U.S. patent application Ser. No. 10/262,729, entitled "Trench Isolation for Thyristor-based Device," filed on Oct. 1, 2002 and to U.S. patent application Ser. No. 09/815,213, entitled "Thyristor-based Device Including Trench Isolation" and filed on Mar. 22, 2001; both of which are fully incorporated herein by reference.

Figure 3:
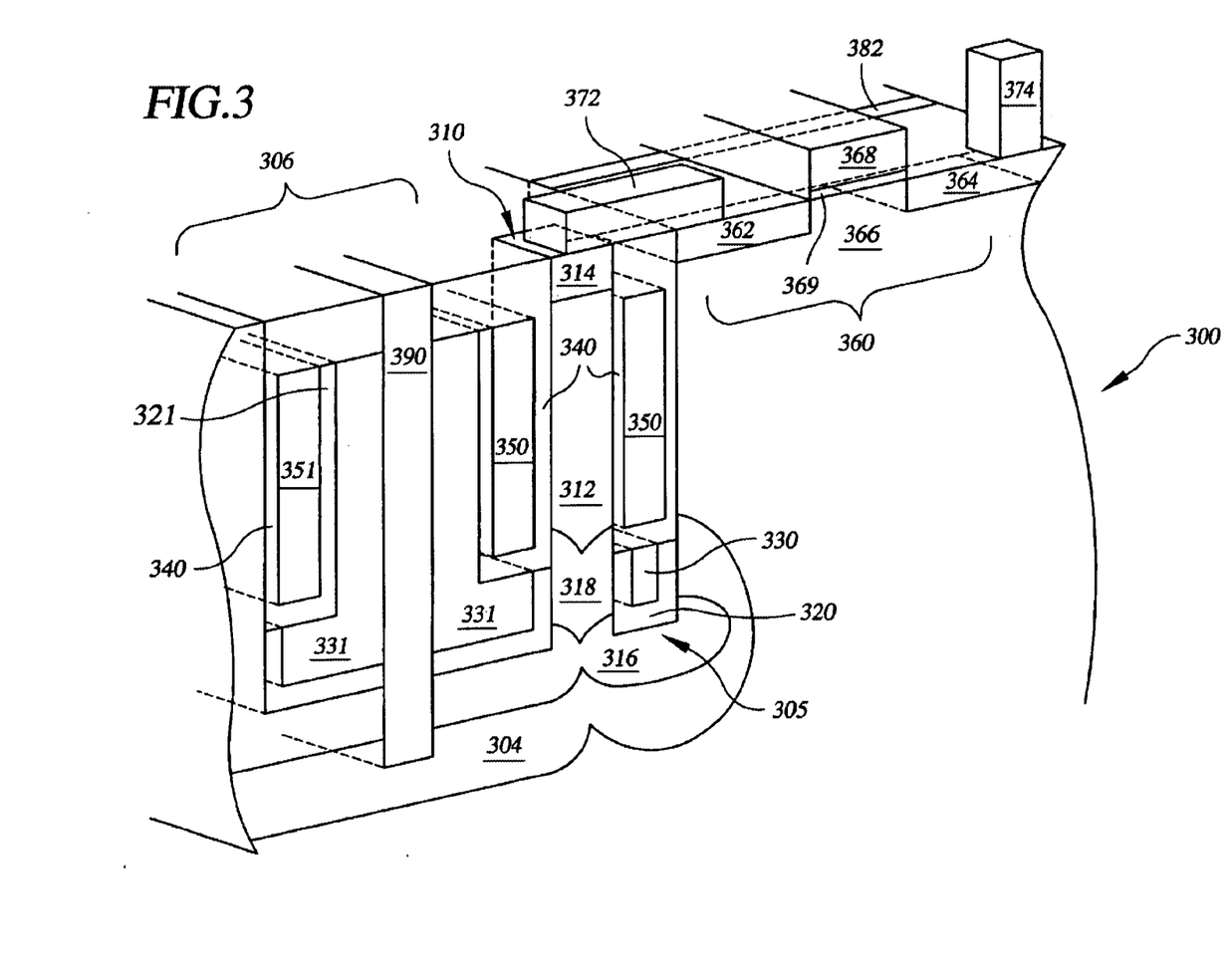
FIG. 3 is a semiconductor device having an anode contact, according to another example embodiment of the present invention.

FIG. 3 shows another thyristor-based semiconductor device 300, similar to the device shown in FIG. 2 and from a three-dimensional perspective, according to another example embodiment of the present invention. Various hidden lines have been omitted and/or truncated for clarity. Trenches 305 and 306 are lined with an insulative material 320, filled with conductive filler material 330 and 331, respectively, lined with a dielectric material 340 and further filled with control ports 350 and 351. Insulative material 321 lines the filler material 331, and an N+ control port 351 is formed on the insulative liner material 321. A single conductive contact 390 extends through the P+ emitter 316 and into the N-well 304, making electrical contact to both. In one implementation, the conductive contact 390 is metal, and in another implementation, the conductive contact is doped polysilicon with a metal liner disposed between the doped polysilicon and the conductive filler material 331, with the metal liner shorting the conductive filler material 331 with the P+ emitter 316. Control port 350 is adapted to capacitively couple to P base region 312, in a manner similar to the capacitive coupling of the control port 250 to P base region 212 in FIG. 2. Control port 351 may be used for contacting additional thyristor-based devices (e.g., for an array of such devices), which are not shown for brevity. The insulative liner materials 320 and 321 are adapted to electrically insulate conductive filler materials 330 and 331 from the N base region 310 and the N+ control ports 350 and 351. In addition, a shallow trench isolation (STI) region 382 is disposed adjacent to the pass device 360 for electrically isolating the source/drain regions 362 and 364 from adjacent circuitry (not shown).

Figure 4:
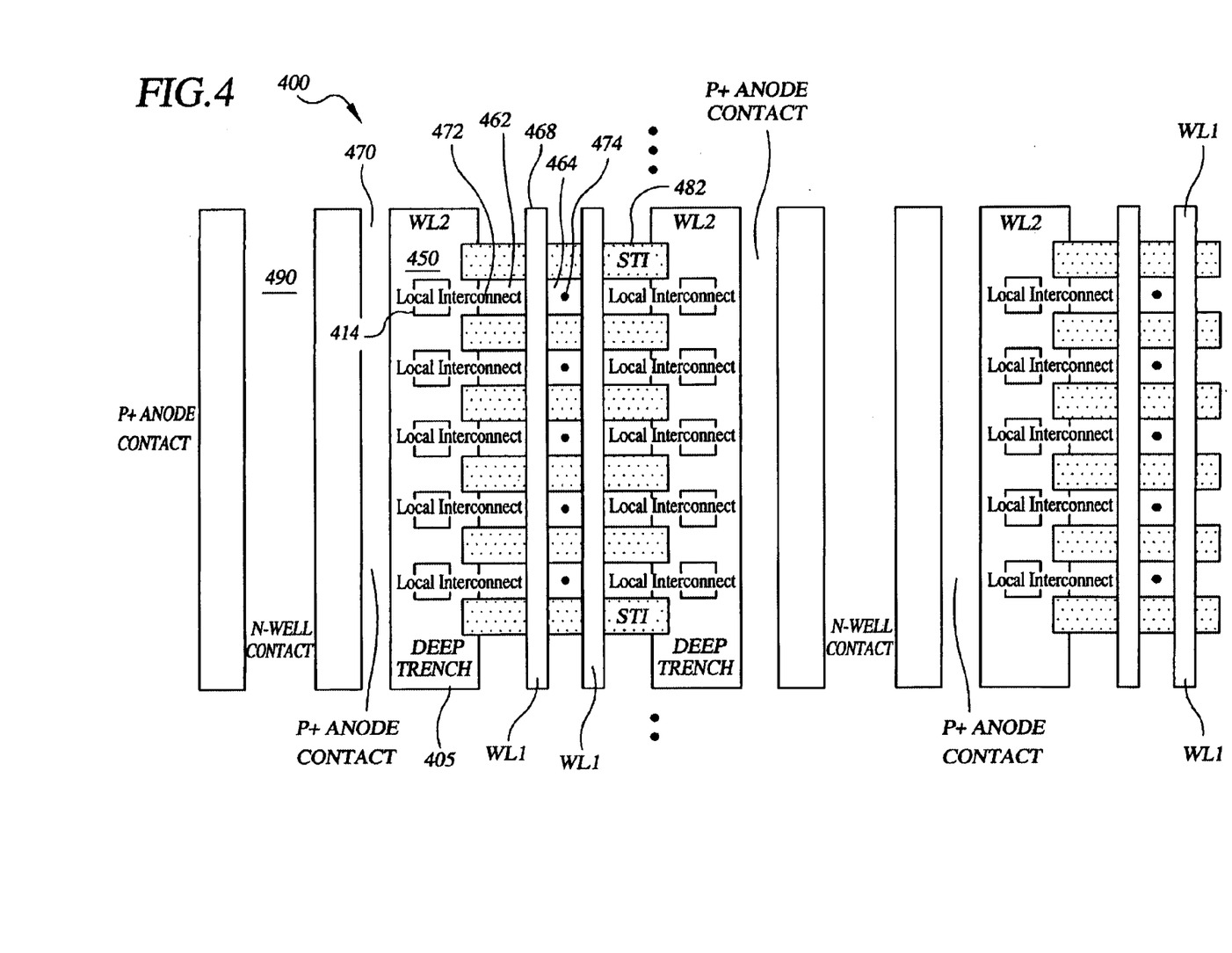
FIG. 4 is an array of semiconductor devices with insulative trenches, according to another example embodiment of the present invention.

FIG. 4 shows a memory array 400 including a plurality of thyristor-based devices, according to another example embodiment of the present invention. The array includes memory cells with pass devices separated by shallow trench isolation (STI) 482, which is similar to the STI 382 shown in FIG. 3, and with thyristors separated by deep trench isolation (DTI) and adapted to store information. Word line 468 forms the gate of a pass device having source/drain regions 462 and 464 (e.g., similar to logic device 260 of FIG. 2). Each cell includes a thyristor having vertical portions with an N+ cathode region 414 at an upper portion and coupled in series with the pass device via local interconnect 472. The thyristor is coupled to a control port 450 formed in a trench 405 around the thyristor. The trench 405 further includes a filled lower portion including a conductive portion surrounded by a trench liner and adapted to electrically isolate a portion of the thyristor from the conductive portion. The filled lower portion of the trench may include one or more of similar materials shown in the other figures.

Figure 5:
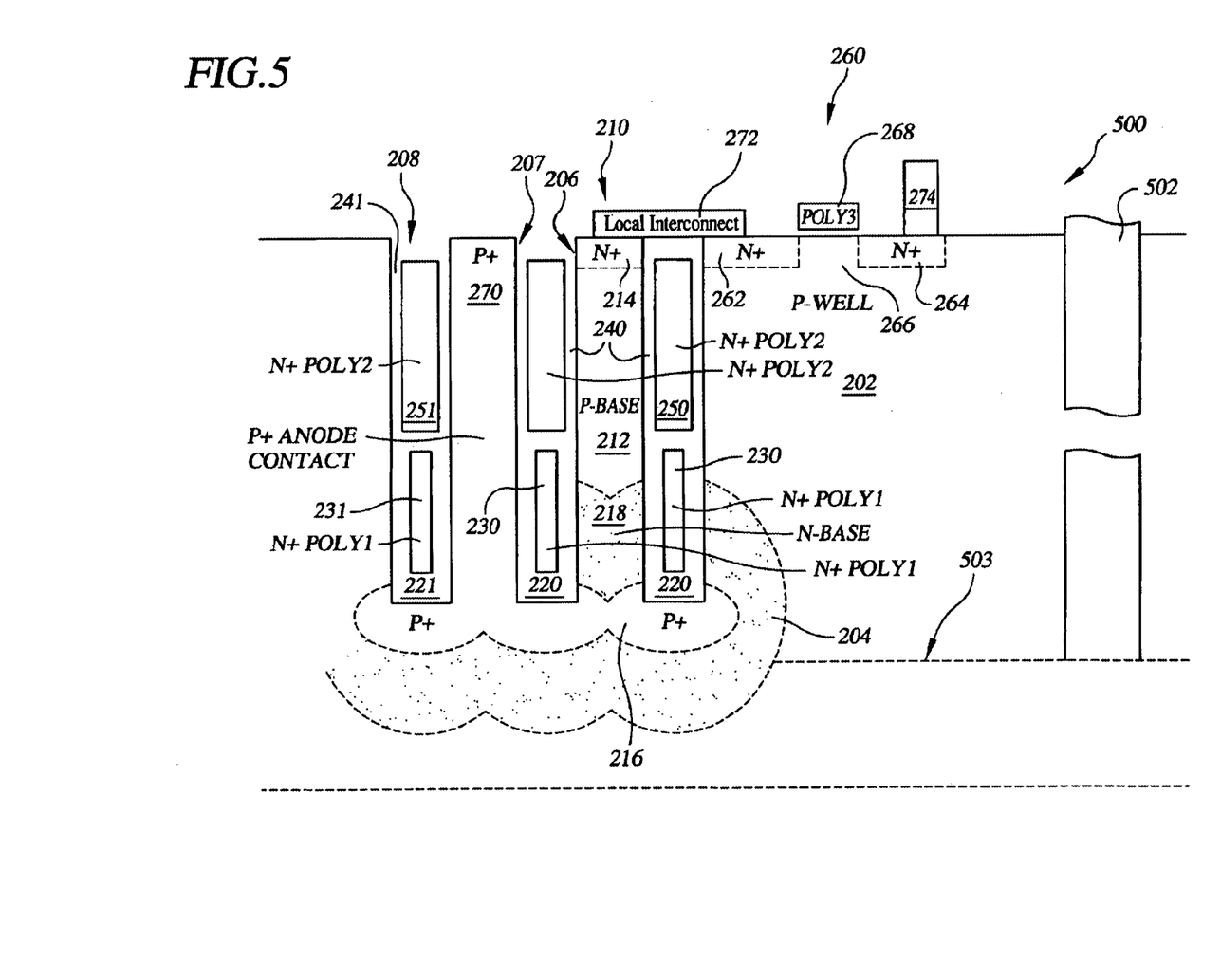
FIG. 5 is a semiconductor device having an anode contact, according to another example embodiment of the present invention.

FIG. 5 is a thyristor-based semiconductor device 500, similar to the device shown in FIG. 2 and having a deep N-doped region 503 adapted to drain carriers from the Nwell region 204, according to another example embodiment of the present invention. The device 500 has its articles labeled using reference numbers common to those used in connection with the device 200 shown in FIG. 2 for brevity. The deep N-doped region 503 is below the P+ anode regions 216 and is electrically coupled to an N-well tap 502 that extends to a surface of the substrate 202. The deep N-doped region 503 may be formed, for example, using a high-energy implant or by doping the substrate 503 with subsequent epitaxial silicon deposition of the substrate 202. During operation of the device 500, carriers are drained from the P+ anode emitter region 216, through the N-well region 204, the deep N-doped region 503 and to the N-well tap 502.

In a more particular example embodiment (not shown), the N-doped region 503 is electrically coupled to N-well regions of a plurality of thyristor-based devices and adapted for draining carriers from each of the plurality of thyristor-based devices. This arrangement is useful for draining carriers from multiple devices using a single N-well tap, which reduces the number of contacts that need to be brought to a surface of the device. For instance, the N-well tap 502 can be used to drain carriers from the P+ anode emitter region 216 of the device 500 and from a similar emitter region of an adjacent device that has an N-well region electrically coupled to the deep N-doped region 503.

Figure 6:
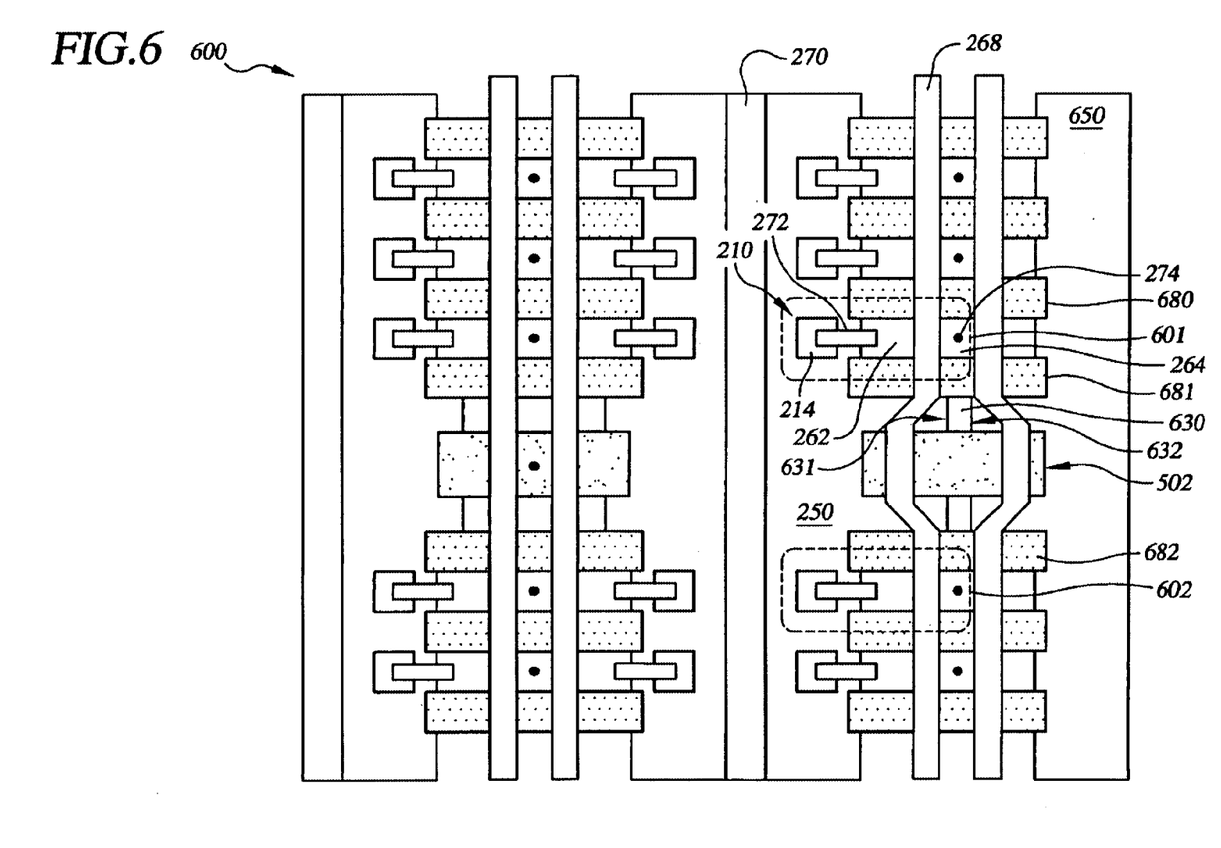
FIG. 6 is an array of semiconductor devices having an anode contact, according to another example embodiment of the present invention.

FIG. 6 shows a memory array 600 having a plurality of memory cells, each memory cell includes a thyristor-based device, such as the device 500 shown in FIG. 5, according to another example embodiment of the present invention. The memory array 600 is shown having its articles labeled using reference numbers common to those used in connection with the other figures, with discussion of those commonly-labeled articles omitted for brevity. In addition, discussion of repeated portions of the array are also omitted for brevity. Shallow trench isolation (STI) regions 680, 681 and 682 separate and electrically isolate adjacent memory cells, with STI regions 681 and 682 also separating memory cells 601 and 602, respectively, from the N-well tap 502. Adjacent memory cells 601 and 602 share control port 250 and pass gate 268 for controlling current flow in thyristor body regions and logic devices, respectively, for each cell (e.g., as discussed above in connection with FIG. 2). A portion 630 of conductive filler material extends between memory cells 601 and 602, as well as below and between control ports 250 and 650 (for which repeated thyristor structures and other structures have been omitted for brevity). Referring to FIG. 3 as an example, the conductive filler material portion 630 is arranged similarly to filler material 331, which extends below as well as upward and between control ports 350 and 351 (e.g., absent the conductive contact 390 extending through the filler material 331). Interfaces 631 and 632 between the conductive filler material portion 630 and control port 250 and 650, respectively, are insulated, thus electrically isolating the control ports 250 and 650 from one another.

In another example embodiment of the present invention, the thyristor body regions in the memory array 600 are interchanged, such that the thyristor is in a cathode-down orientation. In this example embodiment, an N+ cathode emitter region (e.g., region 214) is buried in a P-well region in a substrate, with a P+ anode emitter region (e.g., region 216) being electrically coupled to a pass device. A control port arranged to capacitively couple to an N-base region (e.g., region 218). A conductive contact (e.g., contact 502) extends to the P-well region for draining carriers therefrom. This cathode-down approach is applicable to FIG. 6 as well as to the other example embodiments described herein.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor; and interchanging P and N regions in the device structures and/or using PMOSFETS rather than NMOSFETS. In addition, for more information regarding implementations to which the present invention is applicable, reference may be made to U.S. Pat. No. 6,229,161, which is fully incorporated herein by reference. Such modifications and changes do not depart from the true spirit and scope of the present invention that is set forth in the following claims.

What is claimed is:

1. A thyristor-based semiconductor device comprising:
a substrate with a thyristor body having a doped emitter region buried in a doped well region in the substrate, the emitter region and the well region being of opposite polarity, the doped well region being susceptible to carrier accumulation via carrier drainage from the doped emitter region;
a control port adapted to capacitively couple to the thyristor body and to control current in the thyristor body; and
a carrier coupler electrically coupled to the doped well region and configured and arranged to drain carriers from the doped well region.

2. The thyristor-based device of claim 1, further comprising a reversed-biased junction disposed adjacent to the emitter and adapted to reduce carrier lifetime in the emitter, the reverse-biased junction including the carrier coupler.

3. The thyristor-based semiconductor device of claim 1, wherein the carrier coupler is adapted to be held at a voltage level that is at least as high as a voltage level of the doped emitter region.

4. The thyristor-based semiconductor device of claim 1, wherein the carrier coupler includes metal.

5. The thyristor-based semiconductor device of claim 1, wherein the carrier coupler includes doped polysilicon.

6. The thyristor-based semiconductor device of claim 1, wherein the carrier coupler is adapted to effect a low-resistance connection to the well region and to prevent parasitic bipolar junction transistors from turning on.

7. The thyristor-based semiconductor device of claim 1, further comprising a carrier recombination center disposed in a current path through the emitter region and adapted to speed the turn off time of the thyristor body.

8. The thyristor-based semiconductor device of claim 7, wherein the carrier recombination center is a metal-doped portion of the emitter region.

9. The thyristor-based semiconductor device of claim 7, wherein the carrier recombination center is a portion of the emitter having silicon lattice damage.

10. The thyristor-based semiconductor device of claim 1, wherein the well region includes epitaxially grown silicon.

11. The thyristor-based semiconductor device of claim 1, wherein the well region includes doped silicon.

12. The thyristor-based semiconductor device of claim 1, wherein the carrier coupler includes a doped coupler region in the substrate that is electrically coupled to the well region and extends laterally from the well region.

13. The thyristor-based semiconductor device of claim 12, wherein the doped coupler region extends below the well region.

14. The thyristor-based semiconductor device of claim 12, wherein the doped coupler region is electrically coupled to well regions of a plurality of thyristors, each thyristor having doped emitter regions buried in respective well regions, wherein the doped coupler region is configured and arranged for draining carriers from the emitter regions of the plurality of thyristors.

15. The thyristor-based semiconductor device of claim 13, further comprising at least one conductive well tap extending from a surface of the substrate to the doped couplet region and configured and arranged for draining carriers from the doped coupler region.

16. The thyristor-based semiconductor device of claim 12, wherein the doped coupler region is configured and arraigned to lower the resistance of the well region.

17. A thyristor-based semiconductor device comprising:
a substrate with a thyristor body having a doped emitter region buried in a doped well region in the substrate, the emitter region and the well region being of opposite polarity, the doped well region being susceptible to carrier accumulation via carrier drainage from the doped emitter region;
means for capacitively coupling to the thyristor body and for controlling current in the thyristor body; and
means for electrically coupling to the doped well region and for draining carriers from the doped well region.

18. A thyristor-based memory cell comprising:
a substrate with a thyristor body having a first doped emitter region buried in a doped well region in the substrate, the emitter region and the well region being of opposite polarity, the doped well region being susceptible to carrier accumulation via carrier drainage from the doped emitter region and the emitter region being configured and arranged for storing data therein;
a first base region coupled between the doped emitter region and a second base region, the second base region being coupled between the first base region and a second emitter region, the second emitter region being electrically coupled to a reference voltage signal;
a control port adapted to capacitively couple to the first base region and to control current in the thyristor body;

a carrier coupler electrically coupled to the doped well region and configured and arranged to drain carriers from the doped well region; and a pass device electrically coupled between a bit line and the first emitter region, the pass device being configured and arranged for electrically coupling the bit line to the first emitter region in response to a signal applied thereto.

* * * * *

UNITED STATES PATENT AND TRADEMARK OFFICE
CERTIFICATE OF CORRECTION

PATENT NO. : 6,756,612 B1 Page 1 of 1
APPLICATION NO. : 10/282331
DATED : June 29, 2004
INVENTOR(S) : Nemati et al.

It is certified that error appears in the above-identified patent and that said Letters Patent is hereby corrected as shown below:

Col. 1, line 35: "(e.g., high density 0has" should read -- (e.g., high density has --.

Col. 1, line 39: "approximately 50 nSec" should read -- approximately 50nSec --.

Col. 10, line 35: "doped couplet" should read -- doped coupler --.

Col. 10, line 40: "arraigned to lower" should read -- arranged to lower --.

Signed and Sealed this

Sixth Day of February, 2007

JON W. DUDAS
*Director of the United States Patent and Trademark Office*